US012610747B2

(12) United States Patent     (10) Patent No.:   US 12,610,747 B2
Kim et al.                        (45) Date of Patent:         Apr. 21, 2026

(54) MAGNETIC TUNNELING JUNCTION DEVICE, MEMORY DEVICE INCLUDING THE SAME, AND METHOD OF MANUFACTURING THE MAGNETIC TUNNELING JUNCTION DEVICE

(71) Applicant: Samsung Electronics Co., Ltd., Suwon-si (KR)

(72) Inventors: Kwangseok Kim, Seoul (KR); Seonggeon Park, Seongnam-si (KR); Naoki Hase, Hwaseong-si (KR); Seungjae Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 386 days.

(21) Appl. No.: 17/584,916

(22) Filed: Jan. 26, 2022

(65) Prior Publication Data

US 2022/0285607 A1     Sep. 8, 2022

(30) Foreign Application Priority Data

Mar. 4, 2021    (KR) ........................ 10-2021-0028968

(51) Int. Cl.
    *H10N 50/80*       (2023.01)
    *H10N 50/01*       (2023.01)
    *H10N 50/85*       (2023.01)

(52) U.S. Cl.
    CPC ............. *H10N 50/80* (2023.02); *H10N 50/01* (2023.02); *H10N 50/85* (2023.02)

(58) Field of Classification Search
    CPC ........ H10N 50/80; H10N 50/01; H10N 50/85; H10N 50/10; H10B 61/22; H10B 61/20; G11C 11/161
    See application file for complete search history.

(56) References Cited

U.S. PATENT DOCUMENTS 6,544,801 B1    4/2003   Slaughter et al.
7,598,578 B2 *   10/2009   Nakamura ............. H10N 50/10
                                      257/E43.001

(Continued)

FOREIGN PATENT DOCUMENTS

CN       1801331 A   *   7/2006   ............. B82Y 10/00
CN    101154709 B   *   6/2010   ............. B82Y 10/00

(Continued)

OTHER PUBLICATIONS

Extended European Search Report dated Mar. 21, 2023 issued in European Patent Application No. 22153643.6-1212.

(Continued)

*Primary Examiner* — Mohammed Shamsuzzaman

(74) *Attorney, Agent, or Firm* — Harness, Dickey & Pierce, P.L.C.

(57) ABSTRACT

Provided are magnetic tunneling junction devices, memory devices including the magnetic tunneling junction devices, and methods of manufacturing the magnetic tunneling junction devices. The magnetic tunneling junction device includes a first magnetic layer; a second magnetic layer disposed to face the first magnetic layer; and a first oxide layer disposed between the first magnetic layer and the second magnetic layer and including a metal oxide, wherein the metal oxide of the first oxide layer has a stoichiometrically oxygen-deficient composition, and wherein the second magnetic layer includes a magnetic material doped with a metal element.

20 Claims, 10 Drawing Sheets

(56) References Cited

U.S. PATENT DOCUMENTS

| | | | | |
|---|---|---|---|---|
| 7,679,155 B2* | 3/2010 | Korenivski | ........... | B82Y 25/00 |
| | | | | 257/E43.001 |
| 8,582,253 B1* | 11/2013 | Zheng | ................. | G11B 5/1278 |
| | | | | 360/324.2 |
| 9,184,375 B1* | 11/2015 | Tang | ...................... | H10N 50/01 |
| 9,218,826 B1* | 12/2015 | He | ....................... | G11B 5/3906 |
| 9,564,581 B1* | 2/2017 | Choi | .................... | G11C 11/161 |
| 10,283,701 B1* | 5/2019 | Ikhtiar | ................. | G11C 11/161 |
| 2006/0092696 A1 | 5/2006 | Bessho | | |
| 2008/0023740 A1* | 1/2008 | Horng | ................... | H10N 50/01 |
| | | | | 257/295 |
| 2009/0067232 A1* | 3/2009 | Korenivski | ........... | B82Y 25/00 |
| | | | | 365/171 |
| 2011/0064969 A1 | 3/2011 | Chen et al. | | |
| 2011/0233698 A1* | 9/2011 | Kim | ....................... | H10N 50/85 |
| | | | | 257/E29.323 |
| 2012/0205762 A1* | 8/2012 | Matsukawa | .......... | H01F 10/329 |
| | | | | 257/E29.323 |
| 2013/0177781 A1 | 7/2013 | Chepulskyy et al. | | |
| 2013/0249026 A1* | 9/2013 | Kitagawa | ............... | H10B 61/22 |
| | | | | 257/E29.323 |
| 2014/0001586 A1* | 1/2014 | Shen | ...................... | H10N 50/85 |
| | | | | 257/421 |
| 2015/0280111 A1* | 10/2015 | Yuasa | .................... | H10N 50/80 |
| | | | | 257/421 |
| 2015/0325782 A1* | 11/2015 | Ohmori | ................. | H10N 50/10 |
| | | | | 257/421 |
| 2015/0357015 A1* | 12/2015 | Kent | ................... | G11C 11/5607 |
| | | | | 365/158 |
| 2016/0180869 A1* | 6/2016 | Zhang | ................. | G11B 5/3909 |
| | | | | 428/811.1 |
| 2016/0211440 A1* | 7/2016 | Siddik | .................... | H10N 50/01 |
| 2017/0294571 A1 | 10/2017 | Park et al. | | |
| 2019/0157547 A1 | 5/2019 | Ikhtiar et al. | | |
| 2020/0058845 A1* | 2/2020 | Hu | ......................... | H10B 61/00 |
| 2020/0259077 A1* | 8/2020 | Yuasa | .................... | H10N 50/85 |
| 2020/0303628 A1* | 9/2020 | Daibou | .................. | H10N 50/10 |
| 2021/0288244 A1* | 9/2021 | Uchida | ................. | G11B 5/3909 |
| 2022/0013579 A1* | 1/2022 | Daibou | .................. | H10N 50/85 |
| 2022/0020409 A1* | 1/2022 | Shin | ...................... | H10N 50/01 |
| 2022/0115588 A1* | 4/2022 | Yuasa | .................... | H10N 50/85 |
| 2023/0059590 A1* | 2/2023 | Kim | ...................... | H10N 50/85 |

FOREIGN PATENT DOCUMENTS

| | | | | | |
|---|---|---|---|---|---|
| CN | 102683580 A | * | 9/2012 | ............ | B82Y 40/00 |
| CN | 103490006 A | * | 1/2014 | .......... | G01R 33/098 |
| CN | 107785485 A | | 3/2018 | | |
| CN | 112736190 A | * | 4/2021 | .......... | G11C 11/161 |
| CN | 112864306 A | * | 5/2021 | ............ | H10B 61/00 |
| EP | 1 737 055 A1 | | 12/2006 | | |
| JP | 2005-268251 A | | 9/2005 | | |
| JP | 2006-128579 A | | 5/2006 | | |
| JP | 2009-043993 A | | 2/2009 | | |
| JP | 4581133 B2 | | 11/2010 | | |
| JP | 6049032 B2 | | 12/2016 | | |
| JP | 2017123355 A | * | 7/2017 | ........ | H01J 37/32816 |
| JP | 2018-502450 A | | 1/2018 | | |
| KR | 10-2010-0045037 A | | 5/2010 | | |
| KR | 10-2014-0107143 A | | 9/2014 | | |
| KR | 10-2018-0016678 A | | 2/2018 | | |
| WO | WO-0219389 A2 | * | 3/2002 | ............ | G11C 11/22 |
| WO | 2005088745 A1 | | 9/2005 | | |
| WO | WO-2020150419 A1 | * | 7/2020 | .......... | G11C 11/161 |

OTHER PUBLICATIONS

Korean Notice of Non-Final Rejection dated Dec. 12, 2024 issued in Korean Patent Application No. 10-2021-0028968.

Korean Office Action dated Oct. 18, 2025 issued in Korean Patent Application No. 10-2021-0028968.

Japanese Office Action dated Mar. 3, 2026 issued in corresponding Japanese Patent Appln. No. 2022-033441 (with English translation).

* cited by examiner

100

— 106

— 105

— 102

— 101

— 102

— 101

MAGNETIC TUNNELING JUNCTION DEVICE, MEMORY DEVICE INCLUDING THE SAME, AND METHOD OF MANUFACTURING THE MAGNETIC TUNNELING JUNCTION DEVICE

CROSS-REFERENCE TO RELATED APPLICATION

This application is based on and claims priority under 35 U.S.C. § 119 to Korean Patent Application No. 10-2021-0028968, filed on Mar. 4, 2021, in the Korean Intellectual Property Office, the disclosure of which is incorporated by reference herein in its entirety.

BACKGROUND

Some example embodiments relate to magnetic tunneling junction devices, memory devices including the magnetic tunneling junction devices, and/or methods of manufacturing the magnetic tunneling junction devices.

The resistance of a magnetic tunneling junction device varies with the magnetization direction of a free layer. For example, when the magnetization direction of the free layer is the same as the magnetization direction of a pinned layer, the magnetic tunneling junction device may have low resistance, and when the magnetization directions are opposite to each other, the magnetic tunneling junction device may have high resistance. When this characteristic is used in a memory device, for example, the magnetic tunneling junction device having low resistance may correspond to logical data '0', and the magnetic tunneling junction device having high resistance may correspond to logical data '1'.

A magnetic memory device such as a magnetic random access memory (MRAM) is a memory device that stores data by using a change in the resistance of the magnetic tunneling junction device. Such a magnetic memory device has advantages such as non-volatility, high-speed operation, and/or high durability. For example, Spin Transfer Torque-Magnetic RAM (STT-MRAM) that is currently mass-produced may have an operating speed of about 50 to 100 nanoseconds (ns) and also have excellent data retention greater than or equal to 10 years. In addition, research is underway to achieve a faster operation speed of less than 10 ns.

SUMMARY

Provided are magnetic tunneling junction devices, memory devices including the magnetic tunneling junction devices, and/or methods of manufacturing the magnetic tunneling junction devices.

Additional aspects will be set forth in part in the description which follows and, in part, will be apparent from the description, or may be learned by practice of various example embodiments.

According to some example embodiments, a magnetic tunneling junction device includes a first magnetic layer, a second magnetic layer facing the first magnetic layer, and a first oxide layer disposed between the first magnetic layer and the second magnetic layer and including a metal oxide. The metal oxide of the first oxide layer has a stoichiometrically oxygen-deficient composition, and the second magnetic layer includes a magnetic material doped with a metal element.

The first oxide layer may include a first region adjacent to the first magnetic layer and a second region adjacent to the second magnetic layer, and a proportion of an element such as oxygen or nitrogen in the second region may be greater than a proportion of the element in the first region.

The first oxide layer may further include a metal layer between the first region and the second region.

A thickness of the second region may be less than a thickness of the first region.

A thickness of the metal layer may be about 2 Å to about 3 Å (about 0.2 nm to about 0.3 nm).

A metal material of the metal layer may be the same as a metal material of the metal oxide of the first oxide layer.

The magnetic tunneling junction device may further include a second oxide layer facing the first oxide layer with the second magnetic layer between the first oxide layer and the second oxide layer, the second oxide layer including a metal oxide.

The metal oxide of the second oxide layer may have a stoichiometrically oxygen-deficient composition.

The second oxide layer may include a first region farther from the second magnetic layer, and a second region adjacent to the second magnetic layer, and a proportion of the element such as oxygen or nitrogen in the second region may be higher than a proportion of the element in the first region.

The second oxide layer may further include a metal layer between the first region and the second region.

The first oxide layer may include MgO, and a proportion of Mg in the first oxide layer may be greater than 50 at % and a proportion of O in the first oxide layer may be less than 50 at %.

An oxygen affinity of the metal element of the second magnetic layer may be greater than that of the magnetic material of the second magnetic layer.

For example, the magnetic material of the second magnetic layer may include at least one of Fe, Co, Ni, Mn, a Fe-containing alloy, a Co-containing alloy, a Ni-containing alloy, a Mn-containing alloy, and a Heusler alloy, and the metal element of the second magnetic layer may include at least one of Ca, Sc, Y, Mg, Sr, Ba, Zr, Be, Ti, Hf, V, Zn, Nb, Mn, Al, Cr, Li, Cd, Pb, In, Ga, and Ta.

According to some example embodiments, a memory device includes a plurality of memory cells, each of the plurality of memory cells including a magnetic tunneling junction device and a switching device connected to the magnetic tunneling junction device. The magnetic tunneling junction device includes a first magnetic layer, a second magnetic layer facing the first magnetic layer, and an oxide layer between the first magnetic layer and the second magnetic layer and including a metal oxide. The metal oxide of the oxide layer has a stoichiometrically oxygen-deficient composition, and wherein the second magnetic layer includes a magnetic material doped with a metal element.

According some example embodiments, a manufacturing method of a magnetic tunneling junction device includes preparing an oxide layer including a metal oxide, cooling the oxide layer at a temperature range equal to or less than 250 Kelvin (K), depositing a wetting layer including a magnetic material on the oxide layer, oxidizing or nitriding the wetting layer, depositing a magnetic layer including a magnetic material doped with a metal element on the wetting layer, and annealing the magnetic layer at a temperature equal to or greater than 300 K. The metal oxide has a stoichiometrically oxygen-deficient composition.

The manufacturing method may further include, while annealing the magnetic layer, increasing a proportion of at least one of oxygen or nitrogen in a region adjacent to the magnetic layer in the oxide layer by diffusing at least one of oxygen or nitrogen in the wetting layer into the oxide layer.

The temperature range may be greater than or equal to 50 K and less than or equal to 150 K.

The wetting layer may include a thickness of a single layer.

For example, the wetting layer may include at least one of Fe, Co, Ni, Mn, a Fe-containing alloy, a Co-containing alloy, a Ni-containing alloy, a Mn-containing alloy, and a Heusler alloy.

The manufacturing method may further include depositing an additional oxide layer including a metal oxide on the magnetic layer, and depositing an additional magnetic layer including a magnetic material doped with a metal element on the additional oxide layer.

BRIEF DESCRIPTION OF THE DRAWINGS

The above and other aspects, features, and/or advantages of certain example embodiments will be more apparent from the following description taken in conjunction with the accompanying drawings, in which.

DETAILED DESCRIPTION OF VARIOUS EXAMPLE EMBODIMENTS

Figures 1, 2A:
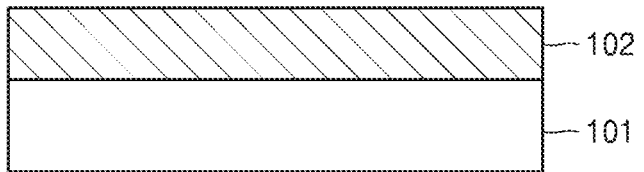
FIG. 1 is a cross-sectional view illustrating a schematic structure of a magnetic tunneling junction device according to some example embodiments.
FIGS. 2A to 2E are cross-sectional views schematically illustrating a process of manufacturing the magnetic tunneling junction device shown in FIG. 1 according to some example embodiments.

Reference will now be made in detail to various embodiments, examples of which are illustrated in the accompanying drawings, wherein like reference numerals refer to like elements throughout. In this regard, the present embodiments may have different forms and should not be construed as being limited to the descriptions set forth herein. Accordingly, example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, with reference to the accompanying drawings, a magnetic tunneling junction device, a memory devices including the magnetic tunneling junction device, and a manufacturing method of the magnetic tunneling junction device will be described in detail. Like reference numerals refer to like elements throughout, and in the drawings, sizes of elements may be exaggerated for clarity and convenience of explanation. Example embodiments described below are merely for example, and various modifications may be possible from various example embodiments.

In a layer structure described below, an expression "above" or "on" may include not only "immediately on in a contact manner" but also "on in a non-contact manner". An expression used in the singular encompasses the expression of the plural unless it has a clearly different meaning in the context. It will be further understood that the terms "comprises" and/or "comprising" used herein specify the presence of stated features or elements, but do not preclude the presence or addition of one or more other features or elements.

The use of "the" and other demonstratives similar thereto may correspond to both a singular form and a plural form. Unless the order of operations of a method according to the present disclosure is explicitly mentioned or described otherwise, the operations may be performed in a proper order. Example embodiments are not limited to the order the operations are mentioned.

The term used in example embodiments such as "unit" or "module" indicates a unit for processing at least one function or operation, and may be implemented in hardware or software, or in a combination of hardware and software.

The connecting lines, or connectors shown in the various figures presented are intended to represent functional relationships and/or physical or logical couplings between the various elements. It should be noted that many alternative or additional functional relationships, physical connections or logical connections may be present in a practical device.

The use of any and all examples, or language provided herein, is intended merely to better illuminate detailed descriptions and does not pose a limitation on the scope of the disclosure unless otherwise claimed.

FIG. 1 is a cross-sectional view illustrating a schematic structure of a magnetic tunneling junction device 100 according to some example embodiments. Referring to FIG. 1, the magnetic tunneling junction device 100 according to some example embodiments may include a first magnetic layer 101, a first oxide layer 102 disposed on the first magnetic layer 101, a second magnetic layer 105 disposed on the first oxide layer 102, and a second oxide layer 106 disposed on the second magnetic layer 105. Here, the expression "disposed on" is for convenience of description and does not necessarily mean a vertical relationship. For example, the first oxide layer 102 may be disposed between the first magnetic layer 101 and the second magnetic layer 105, and the second magnetic layer 105 may be disposed between the first oxide layer 102 and the second oxide layer 106.

The first magnetic layer 101 and the second magnetic layer 105 may include a ferromagnetic metal material having magnetism. For example, the first magnetic layer 101 and the second magnetic layer 105 may include at least one of iron (Fe), cobalt (Co), nickel (Ni), manganese (Mn), a Fe-containing alloy, a Co-containing alloy, a Ni-containing alloy, an Mn-containing alloy and a Heusler alloy. One of the first magnetic layer 101 and the second magnetic layer 105 may be a pinned layer having a pinned magnetization direction, and the other may be a free layer having a variable magnetization direction. The magnetic tunneling junction device 100 has a low resistance when the first magnetic layer 101 and the second magnetic layer 105 have the same (parallel) magnetization direction, and a high resistance when the magnetization directions are opposite (anti-parallel). This phenomenon is called tunneling magnetoresistance (TMR). The magnetic tunneling junction device 100 may be used in a memory device by applying this TMR phenomenon.

The first magnetic layer 101 and the second magnetic layer 105 may include the same magnetic material and may or may not include any other material that is not in common, but are not limited thereto. In order to improve the operating speed of the memory device using the magnetic tunneling junction device 100, the magnetic layer serving as the free layer among the first magnetic layer 101 and the second magnetic layer 105 may have a low saturation magnetization (Ms). For example, the magnetic layer serving as the free layer among the first magnetic layer 101 and the second magnetic layer 105 may not include boron (B). The presence of boron in the free layer may increase saturation magnetization and decrease the switching efficiency of the magnetic tunneling junction device 100. In order to further decrease the saturation magnetization of the free layer, the magnetic layer serving as the free layer among the first magnetic layer 101 and the second magnetic layer 105 may further include a magnetic material doped with a metal element other than boron. The magnetic layer serving as the pinned layer as well as the free layer may not include a magnetic material doped with boron, and may include a boron-free magnetic material or a magnetic material doped with other metal elements.

The first magnetic layer 101 and the second magnetic layer 105 may have high perpendicular magnetic anisotropy (PMA). For example, the perpendicular magnetic anisotropy energy of the first magnetic layer 101 and the second magnetic layer 105 may exceed out-of-plane demagnetization energy. In this case, the magnetic moments of the first magnetic layer 101 and the second magnetic layer 105 may be stabilized in a direction perpendicular to a layer direction (e.g., vertical in FIG. 1). The magnetic tunneling junction device 100 may be applied to STT-MRAM. However, the magnetization directions of the first magnetic layer 101 and the second magnetic layer 105 is not limited to a direction perpendicular to the layer direction, and the first magnetic layer 101 and the second magnetic layer 105 may also have magnetization directions parallel to the layer direction (e.g., horizontal in FIG. 1). Alternatively or additionally, the magnetic tunneling junction device 100 may be applied not only to STT-MRAM but also to spin-orbit coupling torque (SOT) MRAM.

The first oxide layer 102 disposed between the first magnetic layer 101 and the second magnetic layer 105 may serve as a tunnel barrier layer for a magnetic tunneling junction. The first oxide layer 102 may include crystalline Mg oxide. For example, the first oxide layer 102 may include MgO, $MgAl_2O_4$, or $MgTiO_x$. In addition, the second oxide layer 106 may serve as a capping layer. The second oxide layer 106 may include any oxide material, but usually may include the same material as the first oxide layer 102.

FIGS. 2A to 2E are cross-sectional views schematically illustrating a process of manufacturing the magnetic tunneling junction device 100 shown in FIG. 1. Hereinafter, the method of manufacturing the magnetic tunneling junction device 100 shown in FIG. 1 will be described with reference to FIGS. 2A to 2E.

First, referring to FIG. 2A, the first oxide layer 102 is formed on the first magnetic layer 101. The first oxide layer 102 may include a metal oxide having a stoichiometrically oxygen-deficient composition so as to trap oxygen and/or nitrogen generated in a (subsequent) annealing process to be described later. For example, when the first oxide layer 102 includes MgO, a proportion of magnesium (Mg) in the first oxide layer 102 may be greater than 50 at % and a proportion of oxygen (O) in the first oxide layer 102 may be less than 50 at %. Alternatively or additionally, for example, the proportion of magnesium (Mg) in the first oxide layer 102 may be about 52 at % to about 65 at %, and the proportion of oxygen (O) in the first oxide layer 102 may be about 40 at % to about 35 at %. When the first oxide layer 102 includes $MgAl_2O_4$, the proportion of oxygen (O) in the first oxide layer 102 may be less than about 57 at %. For example, the first oxide layer 102 may be formed so as to have an oxygen-deficient composition compared to an inherent oxygen composition of an oxide material forming the first oxide layer 102.

The first oxide layer 102 may be formed through, for example, deposition such as radio frequency (RF) sputtering, and the oxygen composition in the first oxide layer 102 may be adjusted by adjusting an amount of a material supplied on the first magnetic layer 101 in a chamber. Alternatively or additionally, the first oxide layer 102 may be formed by first depositing a metal material on the first magnetic layer 101 and then oxidizing (e.g. thermally oxidizing) the metal material. In this case, the oxygen composition of the first oxide layer 102 may be adjusted by a time for oxidizing the metal material. For example, MgO may be formed by first depositing Mg on the first magnetic layer 101 and then oxidizing Mg. At this time, when oxidation is performed for a time shorter than the time required to completely oxidize Mg, MgO of the first oxide layer 102 may have an oxygen-deficient composition.

After the first oxide layer 102 is formed, the first magnetic layer 101 and the first oxide layer 102 are cooled to a low temperature. In general, the material of the first oxide layer 102 has a relatively low surface energy, while the metal material of the second magnetic layer 105 has a relatively high surface energy. For this reason, when forming the second magnetic layer 105 on the first oxide layer 102, the metal material may not be evenly distributed on a surface of the first oxide layer 102. This problem may be improved by reducing the temperature of the first oxide layer 102 to deteriorate the mobility of the metal material. For example, the first oxide layer 102 may be cooled to a temperature less than or equal to about 250 K, or about 50 K to about 150 K, or about 70 K to about 100 K.

Figure 2B:
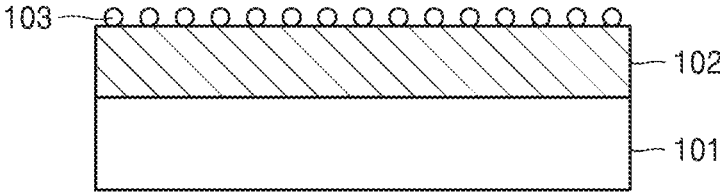

Referring to FIG. 2B, before forming the second magnetic layer 105, a wetting layer 103 may be first formed (e.g. deposited) on the first oxide layer 102. The wetting layer 103 may serve to help deposit the second magnetic layer 105 on the first oxide layer 102 by increasing the surface energy of the first oxide layer 102. The wetting layer 103 may be formed by using a method such as at least one of sputtering, physical vapor deposition (PVD), etc. The wetting layer 103 may be used as a precursor with respect to the second magnetic layer 105. To this end, the wetting layer 103 may include a 3d transition metal and/or an alloy thereof. For example, the wetting layer 103 may include at least one material of Fe, Co, Ni, Mn, a Fe-containing alloy, a Co-containing alloy, a Ni-containing alloy, and a Mn-containing alloy. The wetting layer 103 may include an alloy of other materials, such as a non-transfer metal, except for boron (B); however, example embodiments are not limited thereto.

The wetting layer 103 may have a very thin thickness. For example, the wetting layer 103 may include only two or three monolayers. Although the wetting layer 103 may be distributed substantially uniformly on the first oxide layer 102, because the wetting layer 103 has a very thin thickness, it is not necessary or desired or significant or important to have a completely smooth and continuous distribution, and a void may be partially inside the wetting layer 103.

Figure 2C:
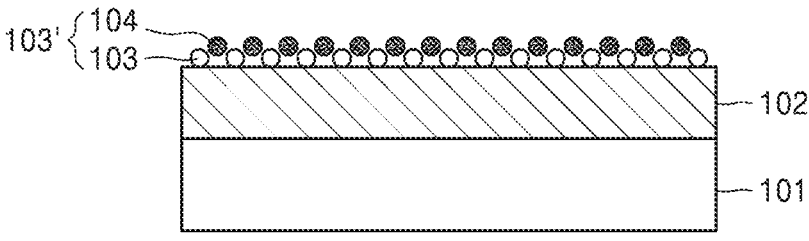

Referring to FIG. 2C, oxygen and/or nitrogen atoms 104 may be combined with the wetting layer 103 by oxidizing or nitrating the wetting layer 103. For example, the wetting layer 103 may be naturally/natively oxidized, and/or other oxidation methods such as reactive oxidation may be used. Alternatively or additionally, the wetting layer 103 may be nitrated naturally and/or through an intentional reaction, such as but not limited to a decoupled plasma nitridation (DPN) process. This oxidation/nitration reaction may be performed until a target resistance area (RA) product is achieved. Although the wetting layer 103 may be completely oxidized and/or nitrated through the oxidation/nitration reaction, the oxidation/nitration reaction may be terminated while the wetting layer 103 is not completely oxidized/nitrated. As a result, an oxidized/nitrated wetting layer 103' is formed on the first oxide layer 102.

Figure 2D:
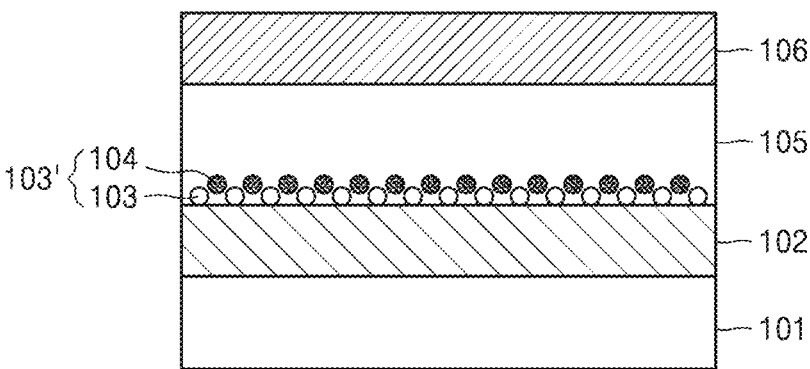

Referring to FIG. 2D, a second magnetic layer 105 may be deposited on the oxidized/nitrated wetting layer 103'. The second magnetic layer 105 may include a boron-free magnetic material that does not include boron (B). For example, in order to form the second magnetic layer 105 on the oxidized/nitrated wetting layer 103', at least one of 3d transition metals such as iron (Fe), cobalt (Co), nickel (Ni), and manganese (Mn), 3d transition metal alloys such as Fe-containing alloy, Co-containing alloy, Ni-containing alloy, and Mn-containing alloy, or Hoisler alloy such as at least one of $Co_2Fe$, $Co_2MnSi$, $Co_2FeMnSi$, $Co_2FeSi$, MnGa, MnGe, etc. may be deposited. Although boron may facilitate the formation of the second magnetic layer 105 on the first oxide layer 102 by reducing the surface energy of the second magnetic layer 105, boron may be a cause of deteriorating switching efficiency of the magnetic tunneling junction device 100, as described above.

Alternatively or additionally, as described above, the second magnetic layer 105 may be doped with an additional metal element other than boron. For example, the additional metal element with which the second magnetic layer 105 is doped may include at least one of calcium (Ca), scandium (Sc), yttrium (Y), magnesium (Mg), strontium (Sr), barium (Ba), zirconium (Zr), beryllium (Be), titanium (Ti), hafnium (Hf), vanadium (V), zinc (Zn), niobium (Nb), manganese (Mn), aluminum (Al), chromium (Cr), lithium (Li), cadmium (Cd), lead (Pb), indium (In), gallium (Ga), and tantalum (Ta). The additional metallic element may be non-magnetic metal, but is not necessarily limited to the non-magnetic metal. For example, the additional metal element with which the second magnetic layer 105 is doped may have an oxygen affinity higher than that of a ferromagnetic material in the second magnetic layer 105 for reasons described later.

In an operation of forming the second magnetic layer 105, the first oxide layer 102 may still be in a cryogenic cooling state. This may be because a time from cooling the first oxide layer 102 to depositing the second magnetic layer 105 may be considerably shorter than a time taken for the temperature of the first oxide layer 102 to naturally rise to room temperature. Even though the temperature of the first oxide layer 102 naturally rises, the temperature of the first oxide layer 102 in the operation of forming the second magnetic layer 105 may be less than or equal to 300 K, for example, less than or equal to 250 K. Or, when the deposition of the second magnetic layer 105 starts, the temperature of the first oxide layer 102 may be less than or equal to 200 K. If necessary or desired, additional cooling may be performed before forming the oxidized/nitrated wetting layer 103' and depositing the second magnetic layer 105.

After the second magnetic layer 105 is formed, a second oxide layer 106 may be further formed on the second magnetic layer 105. The second oxide layer 106 may include the same oxide material as the first oxide layer 102, but may include other oxide materials. However, the second oxide layer 106 is not an indispensable configuration, and in some cases, the operation of forming the second oxide layer 106 may be omitted.

Figure 2E:
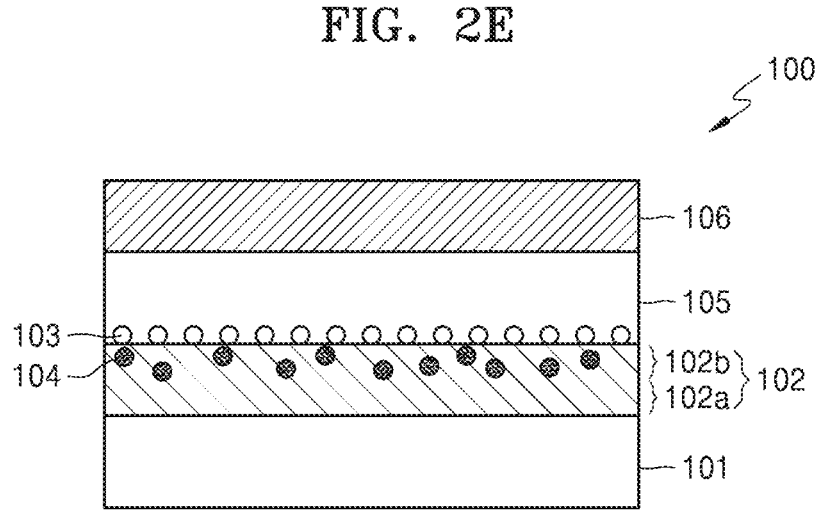

Referring now to FIG. 2E, in order to improve the crystallinity of the second magnetic layer 105, the second magnetic layer 105 may be annealed at a temperature greater than or equal to a room temperature (300 K). For example, rapid thermal annealing (RTA) may be performed. During an annealing process, oxygen and/or nitrogen atoms 104 combined with the oxidized/nitrated wetting layer 103' may diffuse into the first oxide layer 102. The oxygen and/or nitrogen atoms 104 in the oxidized/nitrated wetting layer 103' may diffuse into the first oxide layer 102 so that a proportion of oxygen and/or nitrogen in a region of the first oxide layer 102 adjacent to the second magnetic layer 105 may increase. The wetting layer 103 from which the oxygen and/or nitrogen atoms 104 have escaped may be fused into the second magnetic layer 105 to be virtually indistinguishable from the second magnetic layer 105.

As described above, the first oxide layer 102 has an oxygen-deficient composition. Accordingly, the first oxide layer 102 may be easily or more easily combined with the oxygen and/or nitrogen atoms 104 escaping from the oxidized/nitrated wetting layer 103'. The oxygen and/or nitrogen atoms 104 escaped from the oxidized/nitrated wetting layer 103' may be mainly combined with an upper region of the first oxide layer 102 in contact with the wetting layer 103. Accordingly, after the operation shown in FIG. 2E, the first oxide layer 102 may include a first region 102a adjacent to the first magnetic layer 101 and a second region 102b adjacent to the second magnetic layer 105, and a proportion of oxygen and/or nitrogen in the second region 102b may be greater than a proportion of oxygen or nitrogen in the first region 102a.

In the method of manufacturing the magnetic tunneling junction device 100 shown in FIGS. 2A to 2E, the first magnetic layer 101 may be a pinned layer and the second magnetic layer 105 may be a free layer. According to the method shown in FIGS. 2A to 2E, because the first oxide layer 102 has the oxygen-deficient composition, the oxygen and/or nitrogen atoms 104 escaped from the oxidized/nitrated wetting layer 103' may not diffuse or significantly diffuse into the second magnetic layer 105 (which is the free layer), but may diffuse or more easily diffuse into the first oxide layer 102 and then be trapped in the first oxide layer 102. Accordingly, it may be possible to prevent or reduce the likelihood of and/or impact from an increase in the resistance area (RA) of the magnetic tunneling junction device 100 due to oxygen and/or nitrogen atoms in the free layer.

Figure 3:
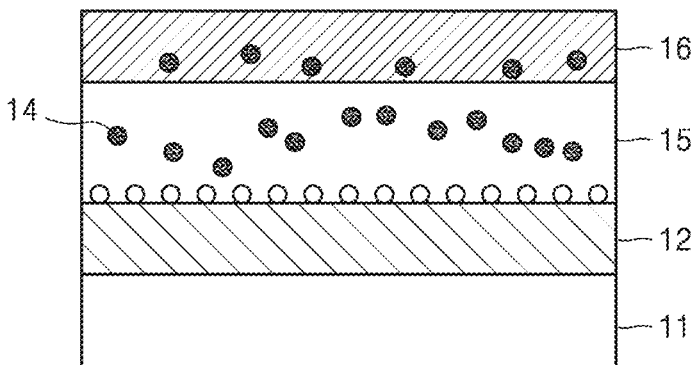
FIG. 3 is a cross-sectional view conceptually illustrating a magnetic tunneling junction device according to a comparative example in which oxygen or nitrogen is trapped in a magnetic layer.

FIG. 3 is a cross-sectional view conceptually illustrating a magnetic tunneling junction device according to a comparative example in which oxygen or nitrogen is trapped in a magnetic layer. Referring to FIG. 3, the magnetic tunneling junction device according to the comparative example includes a first magnetic layer 11, a first oxide layer 12, a second magnetic layer 15, and a second oxide layer 16. The first oxide layer 12 has a stoichiometrically oxygen-sufficient composition. In this case, as shown in FIG. 3, the oxygen or nitrogen atoms 14 separated from a wetting layer may diffuse into the second magnetic layer 15 which is a free layer during an annealing process. The oxygen or nitrogen atoms 14 diffused into the second magnetic layer 15 may cause an increase in the RA of the magnetic tunneling junction device according to the comparative example.

For example, when the second magnetic layer 105 is doped with a metal having a high oxygen affinity, the possibility that the oxygen and/or nitrogen atoms 104 are trapped in the metal having the high oxygen affinity in the second magnetic layer 105 increases. According to various example embodiments, because the first oxide layer 102 having a stoichiometrically oxygen-deficient composition is combined with almost all of the oxygen or nitrogen atoms 104, it is possible to form the second magnetic layer 105 doped with the metal having the high oxygen affinity 105 on the first oxide layer 102 without or with minimal or reduced deterioration. For example, even though the second magnetic layer 105 is doped with a metal having an oxygen affinity higher than the oxygen affinity of a ferromagnetic material in the second magnetic layer 105, the oxygen or nitrogen atoms 104 may hardly diffuse into the second magnetic layer 105 due to the first oxide layer 102 having the oxygen-deficient composition.

Accordingly, according to various example embodiments, a free layer having a low saturation magnetization characteristic may be formed on the oxide layer, and as a result, the operation speed of the magnetic tunneling junction device 100 may be improved. Alternatively or additionally, the RA of the magnetic tunneling junction device 100 may be properly maintained by preventing or reducing the likelihood of and/or impact from oxygen and/or nitrogen from being trapped inside the free layer during a process of forming the free layer having the low saturation magnetization on the oxide layer. Alternatively or additionally, a boron-free free layer of a relatively thin thickness may be more uniformly formed on an oxide layer having a relatively low surface energy. The free layer thus formed may have improved stability and improved perpendicular magnetic anisotropy. Accordingly, the operation speed of the magnetic tunneling junction device 100 may be further improved.

Figure 4:
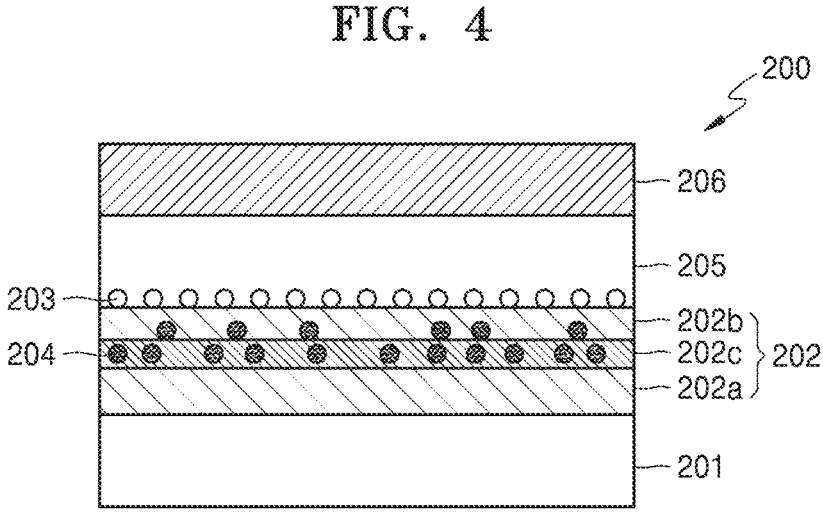
FIG. 4 is a cross-sectional view illustrating a schematic structure of a magnetic tunneling junction device according to some example embodiments.

FIG. 4 is a cross-sectional view illustrating a schematic structure of a magnetic tunneling junction device 200 according to some example embodiments. Referring to FIG. 4, the magnetic tunneling junction device 200 may include a first magnetic layer 201, a first oxide layer 202 disposed on the first magnetic layer 201, a second magnetic layer 205 disposed on the first oxide layer 202, and a second oxide layer 206 disposed on the second magnetic layer 205. For example, the first magnetic layer 201 may be a pinned layer and the second magnetic layer 205 may be a free layer. Also, the first oxide layer 202 may be a tunnel barrier layer and the second oxide layer 206 may be a capping layer. If necessary or desired, the second oxide layer 206 may be omitted.

The first oxide layer 202 may include a metal oxide having a stoichiometrically oxygen-deficient composition. In addition, the first oxide layer 202 may include a first region 202a adjacent to the first magnetic layer 201, a second region 202b adjacent to the second magnetic layer 205, and a metal layer 202c disposed between the first region 202a and the second region 202b. The metal layer 202c may include the same metal material as the metal material of the metal oxide forming the first oxide layer 202. For example, when the first oxide layer 202 includes MgO, the metal layer 202c may include Mg. However, the material of the metal layer 202c is not necessarily limited thereto, and may include other metal materials that are easily deposited on the metal oxide of the first oxide layer 202 and are easily combined with oxygen and/or nitrogen.

The metal layer 202c may serve to trap oxygen or nitrogen atoms 204 escaped from a wetting layer 203 during annealing of the second magnetic layer 205. Due to the metal layer 202c, the first oxide layer 202 may trap more oxygen or nitrogen atoms 204, and further reduce oxygen or nitrogen atoms diffused into the second magnetic layer 205. Because the metal layer 202c is combined with the oxygen and/or nitrogen atom 204 in the annealing process, the final metal layer 202c may be partially oxidized and/or nitrated.

Inside the first oxide layer 202, the metal layer 202c may be disposed as close to the second magnetic layer 205 as possible. To this end, a thickness of the second region 102b of the first oxide layer 202 may be smaller than a thickness of the first region 102a. In addition, the metal layer 202c may have a thin thickness so as not to affect a function of a tunnel barrier layer of the first oxide layer 202. For example, a thickness of the metal layer 202c may be in the range of about 0.2 nm to about 0.3 nm (2 Å to about 3 Å). Meanwhile, as described above, a proportion of oxygen or nitrogen in the second region 102b of the first oxide layer 202 may be higher than a proportion of oxygen or nitrogen in the first region 102a. The remaining configuration of the magnetic tunneling junction device 200 may be the same as the configuration of the magnetic tunneling junction device 100 shown in FIG. 1.

Figure 5:
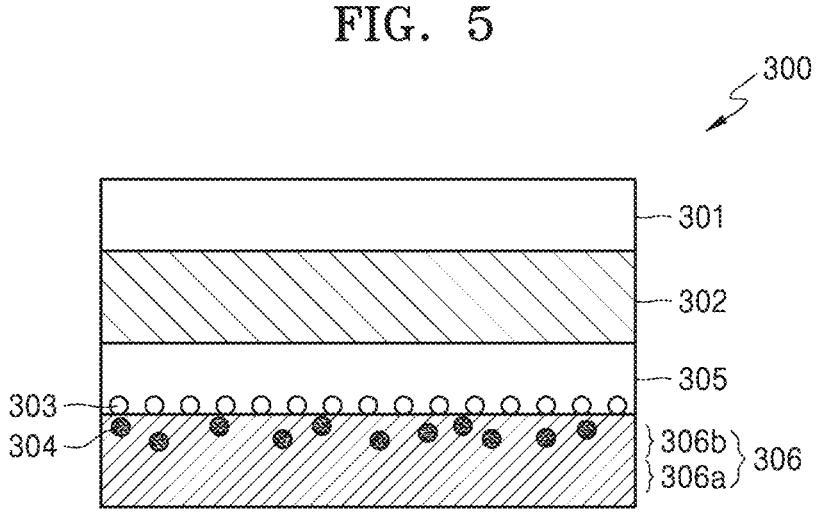
FIG. 5 is a cross-sectional view illustrating a schematic structure of a magnetic tunneling junction device according to some example embodiments.

FIG. 5 is a cross-sectional view illustrating a schematic structure of a magnetic tunneling junction device 300 according to some example embodiments. In the magnetic tunneling junction devices 100 and 200 shown in FIGS. 1 and 4, a pinned layer is disposed on a lower portion and a free layer is disposed on an upper portion. However, the free layer may be disposed on the lower portion and the pinned layer may be disposed on the upper portion. Referring to FIG. 5, the magnetic tunneling junction device 300 may include a second oxide layer 306, a second magnetic layer 305 disposed on the second oxide layer 306, a first oxide layer 302 disposed on the second magnetic layer 305, and a first magnetic layer 301 disposed on the first oxide layer 302. The first magnetic layer 301 may be a pinned layer, the second magnetic layer 305 may be a free layer, the first oxide layer 302 may be a tunnel barrier layer, and the second oxide layer 306 may be a capping layer.

In some example embodiments, the second magnetic layer 305 that is the free layer may be formed on the second oxide layer 306 that is the capping layer. To this end, in a cryogenic cooling state of the second oxide layer 306, a wetting layer 303 may be formed on the second oxide layer 306 and may be oxidized and/or nitrated. In addition, the second oxide layer 306 may have an oxygen-deficient composition so that oxygen or nitrogen atoms 304 from the wetting layer 303 in the annealing process of the second magnetic layer 305 are trapped in the second oxide layer 306 after forming the second magnetic layer 305 on the wetting layer 303. When the annealing process is completed, the second oxide layer 306 includes a first region 306a having a relatively low proportion of oxygen or nitrogen and a second region 306b having a relatively high proportion of oxygen or nitrogen. The second region 306b is a region disposed adjacent to the second magnetic layer 305.

The first oxide layer 302 may include a metal oxide material including a sufficient quantity of oxygen. For example, when the first oxide layer 302 contains MgO, a proportion of each of Mg and O in the first oxide layer 302 may be about 50 at %.

Figure 6:
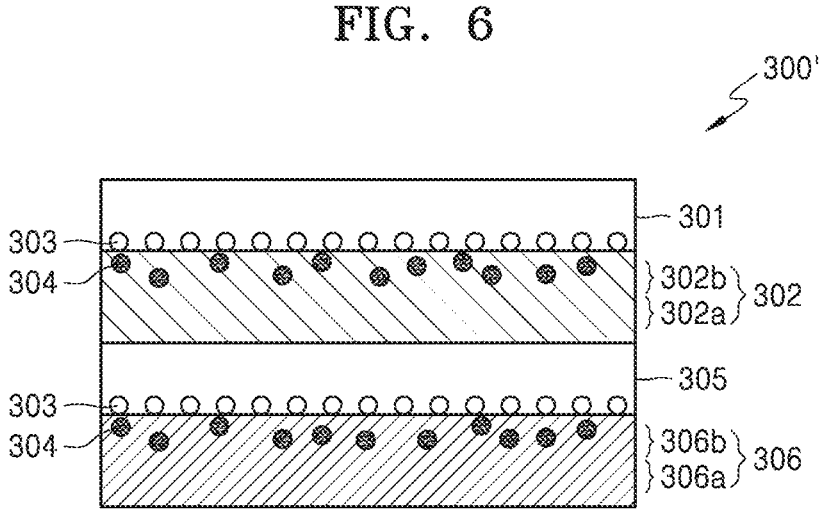
FIG. 6 is a cross-sectional view illustrating a schematic structure of a magnetic tunneling junction device according to some example embodiments.

FIG. 6 is a cross-sectional view illustrating a schematic structure of a magnetic tunneling junction device 300' according to some example embodiments. In the magnetic tunneling junction device 300 illustrated in FIG. 5, the first magnetic layer 301 that is a pinned layer may be deposited on the first oxide layer 302 that is a tunnel barrier layer by using a conventional method. For example, in various example embodiments for example as illustrated in FIG. 5, the first magnetic layer 301 may include a ferromagnetic material including boron, or may not be doped with other metal elements. However, when high quality is also required or desired for the first magnetic layer 301 that is the pinned layer, the first magnetic layer 301 may also include a boron-free magnetic material, and may be doped with other metal elements having a relatively high oxygen affinity.

To this end, referring to FIG. 6, the magnetic tunneling junction device 300' may include the first oxide layer 302 having an oxygen-deficient composition. In addition, in a cryogenic cooling state of the first oxide layer 302, the wetting layer 303 may be formed and oxidized/nitrated on the first oxide layer 302, and the first magnetic layer 301 may be deposited on the wetting layer 303. Thereafter, when the first magnetic layer 301 is annealed, the oxygen and/or nitrogen atoms 304 may be trapped in the first oxide layer 302 without diffusing into the first magnetic layer 301. Accordingly, the first oxide layer 302 includes a first region 302a having a relatively low proportion of oxygen or nitrogen and a second region 302b having a relatively high proportion of oxygen and/or nitrogen. Here, the first region 302a is disposed adjacent to the second magnetic layer 305 and the second region 306b is disposed adjacent to the first magnetic layer 301.

Figure 7:
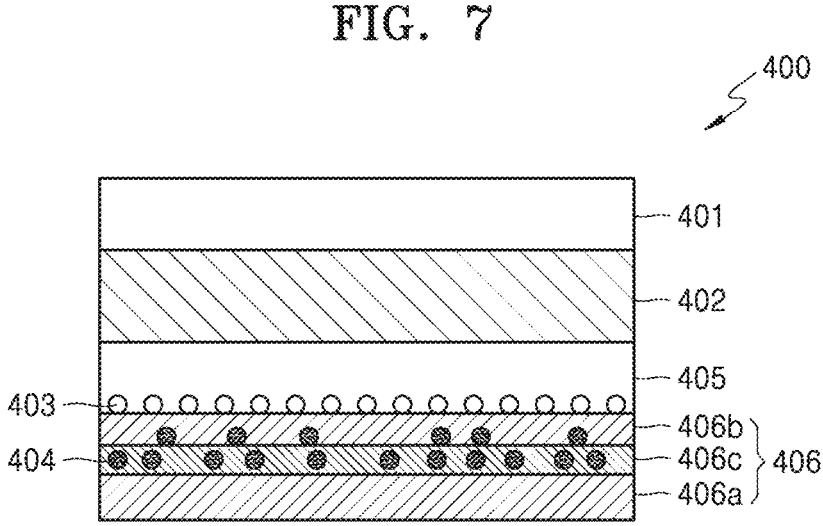
FIG. 7 is a cross-sectional view illustrating a schematic structure of a magnetic tunneling junction device according to some example embodiments.

FIG. 7 is a cross-sectional view illustrating a schematic structure of a magnetic tunneling junction device 400 according to some example embodiments. Referring to FIG. 7, the magnetic tunneling junction device 400 may include a second oxide layer 406, a second magnetic layer 405 disposed on the second oxide layer 406, a first oxide layer 402 disposed on the second magnetic layer 405, and a first magnetic layer 401 disposed on the first oxide layer 402.

The second oxide layer 406 may include a metal oxide having a stoichiometrically oxygen-deficient composition. In addition, the second oxide layer 406 includes a first region 406a having a relatively low proportion of oxygen and/or nitrogen, a second region 406b having a relatively high proportion of oxygen and/or nitrogen, and a metal layer 406c disposed between the first region 406a and the second region 406b. The metal layer 406c may be the same as the metal layer 202c of the first oxide layer 202 described with reference to FIG. 4. Other configurations of the magnetic tunneling junction device 400 that are not described may be the same as those of the magnetic tunneling junction device 300 illustrated in FIG. 5. In addition, the first oxide layer 402 of the magnetic tunneling junction device 400 may further include the configuration described with reference to FIG. 6.

Figure 8:
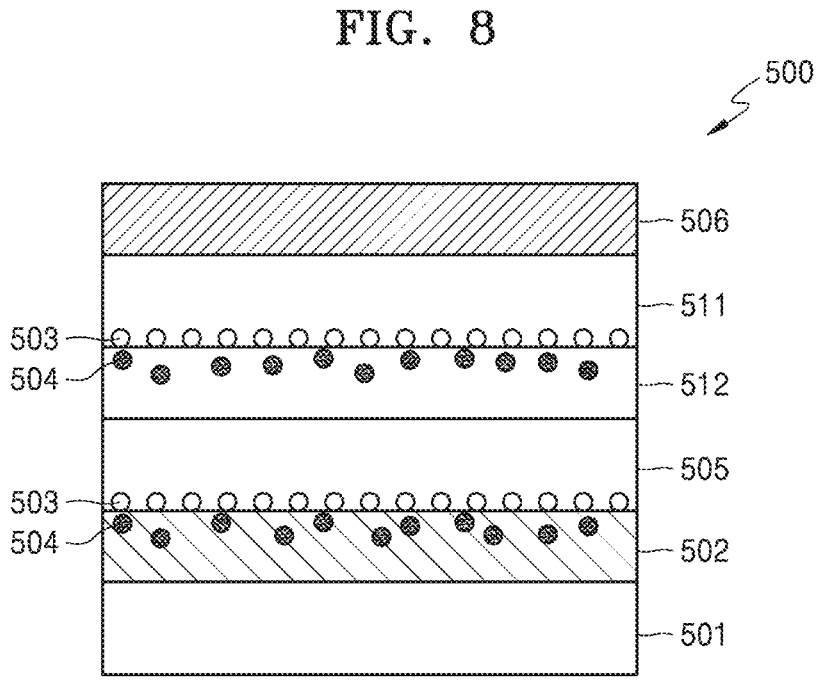
FIG. 8 is a cross-sectional view illustrating a schematic structure of a magnetic tunneling junction device according to some example embodiments.

FIG. 8 is a cross-sectional view illustrating a schematic structure of a magnetic tunneling junction device 500 according to some example embodiments. Referring to FIG. 8, the magnetic tunneling junction device 500 may include a first magnetic layer 501, a first oxide layer 502 disposed on the first magnetic layer 501, a second magnetic layer 505 disposed on the first oxide layer 502, a second oxide layer 512 disposed on the second magnetic layer 505, a third magnetic layer 511 disposed on the second oxide layer 512, and a third oxide layer 506 disposed on the third magnetic layer 511.

The first magnetic layer 501 and the third magnetic layer 511 may be pinned layers, and the second magnetic layer 505 may be a free layer. Accordingly, the magnetic tunneling junction device 500 may include two pinned layers and one free layer disposed therebetween. In addition, the first oxide layer 502 and the second oxide layer 512 may be tunnel barrier layers, and the third oxide layer 506 may be a selective capping layer. In order to trap oxygen and/or nitrogen atoms 504, the first oxide layer 502 disposed below the second magnetic layer 505 that is the free layer may have an oxygen-deficient composition.

In FIG. 8, it is shown that the second oxide layer 512 disposed below the third magnetic layer 511 that is the pinned layer has an oxygen-deficient composition and that the oxygen and/or nitrogen atoms 504 are trapped in the second oxide layer 512. However, this is optional and is not necessarily limited thereto. For example, the second oxide layer 512 may include a metal oxide material including a sufficient quantity of oxygen. The third magnetic layer 511 that is the pinned layer may be deposited on the second oxide layer 512 by using a conventional method.

Figure 9:
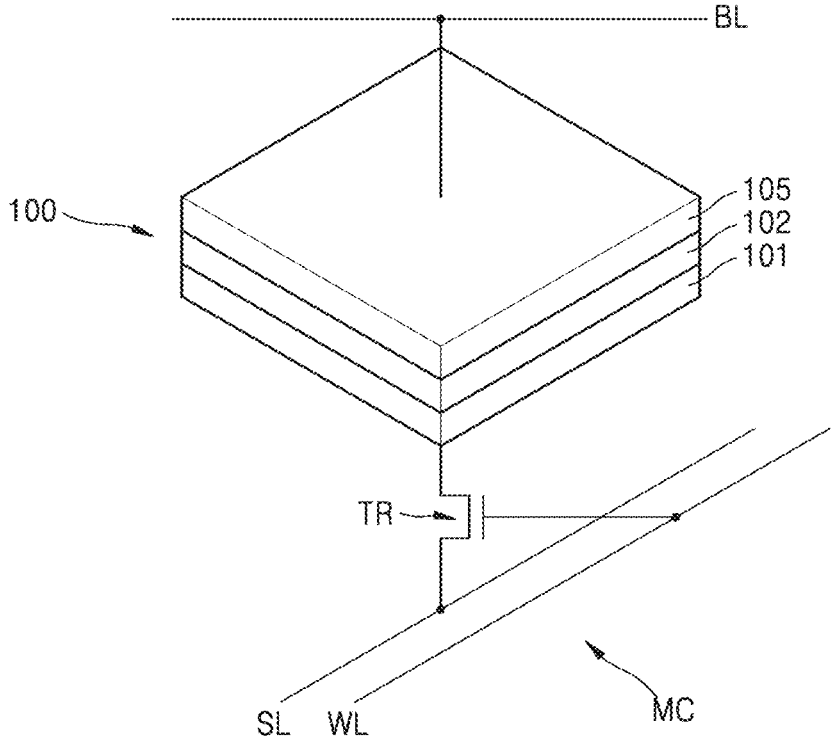
FIG. 9 schematically shows one memory cell including a magnetic tunneling junction device according to some example embodiments.

FIG. 9 schematically shows one memory cell including the magnetic tunneling junction device 100 according to some example embodiments. Referring to FIG. 9, the memory cell MC may include the magnetic tunneling junction device 100 and a switching device TR connected to the magnetic tunneling junction device 100. The switching device TR may be a transistor such as a thin film transistor; however, example embodiments are not limited thereto. The memory cell MC may be connected between a bit line BL and a word line WL. The bit line BL and the word line WL may be disposed to cross each other, and the memory cell MC may be disposed in an intersection point of the bit line BL and the word line WL. The bit line BL may be electrically connected to the second magnetic layer 105 (which is a free layer of the magnetic tunneling junction device 100) and the word line WL may be connected to a gate of the switching device TR. In addition, a first source/drain electrode of the switching device TR may be electrically connected to the first magnetic layer 101 which is a pinned layer of the magnetic tunneling junction device 100 and a second source/drain electrode of the switching device TR may be electrically connected to a selection line SL. In this structure, a write current, a read current, an erase current, etc. may be applied to the memory cell MC through the word line WL and the bit line BL. In FIG. 9, it is shown that the memory cell MC includes the magnetic tunneling junction device 100 shown in FIG. 1, but in various other embodiments, the memory cell MC may include the magnetic tunneling junction devices 200, 300, 400, and 500.

Figure 10:
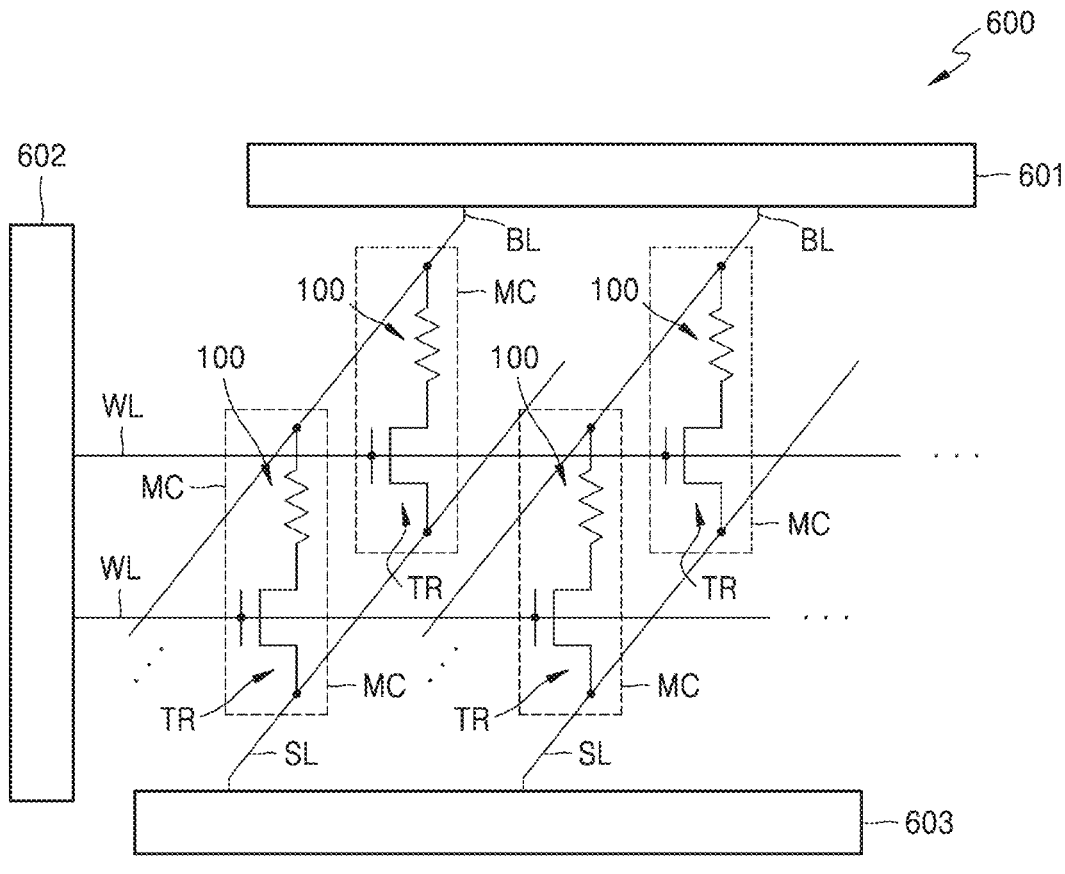
FIG. 10 is a circuit diagram schematically illustrating a configuration of a memory device including a plurality of memory cells shown in FIG. 9.

FIG. 10 is a circuit diagram schematically illustrating a configuration of a memory device 600 including the plurality of memory cells MCs shown in FIG. 9. Referring to FIG. 10, the memory device 600 may include a plurality of bit lines BL, a plurality of word lines WL, a plurality of selection lines SL, the plurality of memory cells MCs respectively disposed in intersection points of the plurality of bit lines BL and the plurality of word lines WL, a bit line driver 601 applying current to the plurality of bit lines BL, a word line driver 602 applying current to the plurality of word lines WL and a selection line driver 603 applying current to the plurality of selection lines SL. Each memory cell MC may have the configuration shown in FIG. 9. The memory device 600 may have a cross-point architecture; however, example embodiments are not necessarily limited thereto.

The memory device 600 illustrated in FIG. 10 may be a magnetic random access memory (MRAM), and may be used in electronic devices using nonvolatile memory. For example, the memory device 600 illustrated in FIG. 10 may be an STT-MRAM in which a magnetization direction of a free layer is changed by a spin current directly applied to the free layer of the magnetic tunneling junction device. The STT-MRAM does not require a separate wire for generating an external magnetic field, and thus the STT-MRAM may be advantageous for high integration and has a simple operation method. Although the STT-MRAM is shown as an example in FIG. 10, the magnetic tunneling junction device may be applied to SOT-MRAM.

Figure 11:
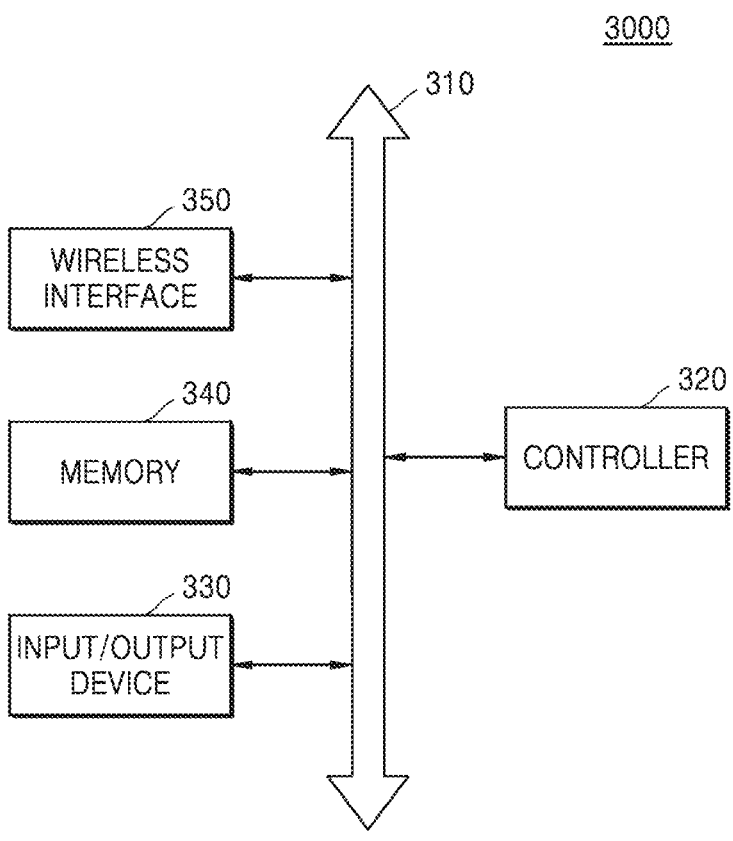
FIG. 11 is a block diagram schematically illustrating an electronic apparatus including a nonvolatile memory device according to some example embodiments.

FIG. 11 is a block diagram schematically illustrating an electronic device 3000 including a nonvolatile memory device such as the nonvolatile memory device 600 illustrated in FIG. 10, according to some example embodiments.

Referring to FIG. 11, the electronic device 3000 according to some example embodiments may include a PDA, a laptop computer, a portable computer, a web tablet, a wireless phone, a mobile phone, a digital music player, a wired/wireless electronic device, or a composite electronic device including at least two of the devices described above. The electronic device 3000 may include at least one of a controller 320, an input/output device 330, such as a keypad, a keyboard, and a display, a memory 340, and a wireless interface 350 combined to each other through a bus 310, and may include at least one active or passive circuit component.

The controller 320 may include, for example, one or more microprocessors, digital signal processors, microcontrollers, or the like. The memory 340 may be used, for example, to store instructions to be executed by controller 320.

The memory 340 may be used to store user data. The memory 340 may include at least one of the magnetic tunneling junction device 100 according to embodiments, and may include the nonvolatile memory device 600 described above with reference to FIG. 10.

The electronic device 3000 may use the wireless interface 350 to transmit data to or receive data from a wireless communication network that communicates with an RF signal. For example, the air interface 350 may include at least one of an antenna, a wireless transceiver, and the like. The electronic device 3000 may be used in a communication interface protocol like a 3G communication system, such as at least one of a Code-division multiple access (CDMA), Global System for Mobiles (GSM), north American digital cellular (NADC), Enhanced-time-division multiple-access (E-TDMA), Wideband Code Division Multiple Access (WCDAM), or CDMA2000.

Figure 12:
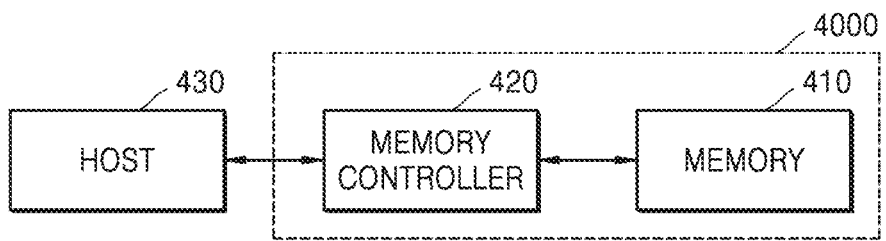
FIG. 12 is a block diagram schematically illustrating a memory system including a nonvolatile memory device according to some example embodiments.

FIG. 12 is a block diagram schematically illustrating a memory system 4000 including a nonvolatile memory device according to some example embodiments.

Referring to FIG. 12, nonvolatile memory devices according to some example embodiments may be used to implement a memory system. The memory system 4000 may include a memory 410 for storing a large amount of data and a memory controller 420. The memory controller 420 controls the memory 410 to read, write, or erase data stored in the memory 410 in response to a read/write/erase request from a host 430. The memory controller 420 may configure an address mapping table for mapping an address provided from the host 430, for example, a mobile device or a computer system, to a physical address of the memory 410. The memory 410 may include the nonvolatile memory device 600 described above with reference to FIG. 10.

Figure 13:
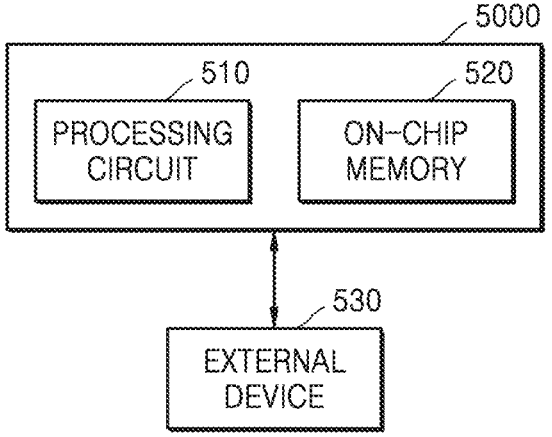
FIG. 13 is a schematic diagram illustrating a device including a memory according to some example embodiments.

The memory device according to various example embodiments described above may be implemented in a chip form and used as a computing platform. For example, FIG. 13 is a schematic diagram illustrating a device 5000 including a memory according to some example embodiments. Referring to FIG. 13, the device 5000 may include a processing circuit 510 and/or a memory 520. The memory 520 may include a magnetic tunnel junction device according to some various example embodiments.

The processing circuit 510 may be configured to control functions for driving the device 5000. For example, the processing circuit 510 may control the device 5000 by executing a program stored in the memory 520 of the device 5000, and may include at least one of the magnetic tunneling junction device 100 described above.

The processing circuit 510 may include hardware, such as at least one logic circuit, a combination of hardware and software, such as a processor that executes software, or a combination thereof. For example, the processor may include a central processing unit (CPU), a graphics processing unit (GPU), an application processor (AP) in the device 5000, an arithmetic logic unit (ALU), a digital processor, a microcomputer, a field programmable gate array (FPGA), System-on-Chip (SoC), a programmable logic unit, a microprocessor, an application-specific integrated circuit (ASIC), etc.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

The above-described magnetic tunneling junction devices, a memory device including the magnetic tunneling junction device, and a manufacturing method of the magnetic tunneling junction device have been described with reference to example embodiments shown in the drawings, but this is only for example, and it will be understood by those of ordinary skill in the art that various modifications and other equivalent embodiments may be made therein. Therefore, the above-described embodiments of the disclosure should be considered in a descriptive sense only and not for purposes of limitation. The scope of the rights is indicated in the claims rather than the above description, and all differences within the scope equivalent thereto should be interpreted as being included in the scope of the rights.

It should be understood that various embodiments described herein should be considered in a descriptive sense only and not for purposes of limitation. Descriptions of features or aspects within each example embodiment should typically be considered as available for other similar features or aspects in other example embodiments. Example embodiments are not necessarily mutually exclusive with one another; for example, some example embodiments may include features described with reference to one or more figures, and may also include other features described with one or more other figures. While various example embodiments have been described with reference to the figures, it will be understood by those of ordinary skill in the art that various changes in form and/or details may be made therein without departing from the spirit and scope as defined by the following claims.

What is claimed is:

1. A magnetic tunneling junction device comprising:
a first magnetic layer;
a second magnetic layer facing the first magnetic layer; and
a first oxide layer between the first magnetic layer and the second magnetic layer and comprising a metal oxide,
wherein the metal oxide of the first oxide layer has a stoichiometrically oxygen-deficient composition, and
the second magnetic layer comprises a magnetic material doped with a metal element,
wherein the metal oxide includes MgO, a proportion of magnesium (Mg) in the metal oxide is greater than 50 at % and a proportion of oxygen (O) in the metal oxide is less than 50 at %,
an oxygen affinity of the metal element doped in the second magnetic layer is greater than an oxygen affinity of the magnetic material of the second magnetic layer,
the magnetic material of the second magnetic layer comprises at least one of Fe, Co, Ni, Mn, a Fe-containing alloy, a Co-containing alloy, a Ni-containing alloy, a Mn-containing alloy, and a Heusler alloy, and
the metal element doped in the second magnetic layer comprises at least one of Ca, Sc, Y, Mg, Sr, Ba, V, Zn, Nb, Al, Cr, Li, Cd, Pb, In, Ga, and Ta;
wherein the first oxide layer comprises a first region adjacent to the first magnetic layer and a second region adjacent to the second magnetic layer, and a proportion of a first element in the second region is greater than a proportion of the first element in the first region, the first element being oxygen or nitrogen diffused to the first oxide layer.

2. The magnetic tunneling junction device of claim 1, wherein the first oxide layer further comprises a metal layer between the first region and the second region.

3. The magnetic tunneling junction device of claim 2, wherein a thickness of the second region is less than a thickness of the first region.

4. The magnetic tunneling junction device of claim 2, wherein a thickness of the metal layer is about 0.2 nm to about 0.3 nm.

5. The magnetic tunneling junction device of claim 2, wherein a metal material of the metal layer is same as a metal material of the metal oxide of the first oxide layer.

6. The magnetic tunneling junction device of claim 1, further comprising:
a second oxide layer facing the first oxide layer with the second magnetic layer between the second oxide layer and the first oxide layer, the second oxide layer comprising a metal oxide.

7. The magnetic tunneling junction device of claim 6, wherein the metal oxide of the second oxide layer has a stoichiometrically oxygen-deficient composition.

8. The magnetic tunneling junction device of claim 7, wherein the second oxide layer comprises a first region disposed farther from the second magnetic layer and a second region adjacent to the second magnetic layer, and
a proportion of a first element in the second region is greater than a proportion of the first element in the first region, the first element being nitrogen or oxygen.

9. The magnetic tunneling junction device of claim 8, wherein the second oxide layer further comprises a metal layer between the first region and the second region.

10. A magnetic tunneling junction device comprising:
a first magnetic layer;
a second magnetic layer facing the first magnetic layer; and
a first oxide layer between the first magnetic layer and the second magnetic layer and comprising a metal oxide,
wherein the first oxide layer comprises a first region adjacent to the first magnetic layer and a second region adjacent to the second magnetic layer, and
a proportion of a first element in the second region is greater than a proportion of the first element in the first region, the first element being oxygen or nitrogen diffused to the first oxide layer,
the metal oxide includes MgO, a proportion of magnesium (Mg) in the metal oxide is greater than 50 at % and a proportion of oxygen (O) in the metal oxide is less than 50 at %,
an oxygen affinity of the metal element doped in the second magnetic layer is greater than an oxygen affinity of a magnetic material of the second magnetic layer,
the magnetic material of the second magnetic layer comprises at least one of Fe, Co, Ni, Mn, a Fe-containing alloy, a Co-containing alloy, a Ni-containing alloy, a Mn-containing alloy, and a Heusler alloy, and
the metal element doped in the second magnetic layer comprises at least one of Ca, Sc, Y, Mg, Sr, Ba, V, Zn, Nb, Al, Cr, Li, Cd, Pb, In, Ga, and Ta.

11. A nonvolatile memory device comprising:
the magnetic tunneling junction device of claim 10; and
a transistor connected to the magnetic tunneling junction device, the transistor configured to control the magnetic tunneling junction device.

12. The nonvolatile memory device of claim 11, wherein the magnetic tunneling junction device is connected to a drain of the transistor, and
the nonvolatile memory device further comprises:
a selection line connected to a source of the transistor; and
a word line connected to a gate of the transistor.

13. An electronic system comprising:
the nonvolatile memory device of claim 11; and
a controller configured to control the nonvolatile memory device to perform at least one of a read operation, a write operation, or an erase operation.

14. The electronic system of claim 13, further comprising:
a processor configured to communicate with the controller, to instruct the controller to store data in the nonvolatile memory device.

15. The magnetic tunneling junction device of claim 1, wherein the first oxide layer has an oxygen-deficient composition compared to an inherent oxygen composition of an oxide material forming the first oxide layer.

16. The magnetic tunneling junction device of claim 15, wherein the proportion of magnesium (Mg) in the metal oxide is greater than 52 at %.

17. The magnetic tunneling junction device of claim 16, wherein the proportion of magnesium (Mg) in the metal oxide is less than 65 at %.

18. The magnetic tunneling junction device of claim 15, wherein the proportion of oxygen (O) in the metal oxide is less than 40 at %.

19. The magnetic tunneling junction device of claim 18, wherein the proportion of oxygen (O) in the metal oxide is greater than 35 at %.

20. The magnetic tunneling junction device of claim 1, wherein the first oxide layer has an oxygen-deficient composition compared to an inherent oxygen composition of an oxide material forming the first oxide layer.

* * * * *